(12) United States Patent  
Nishimoto et al.

(10) Patent No.: US 9,401,340 B2  
(45) Date of Patent: Jul. 26, 2016

(54) SEMICONDUCTOR DEVICE AND CERAMIC CIRCUIT SUBSTRATE, AND PRODUCING METHOD OF SEMICONDUCTOR DEVICE

(71) Applicant: MITSUBISHI MATERIALS CORPORATION, Tokyo (JP)

(72) Inventors: Shuji Nishimoto, Ageo (JP); Yoshiyuki Nagatomo, Saitama (JP); Toshiyuki Nagase, Gotenba (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/433,764

(22) PCT Filed: Oct. 7, 2013

(86) PCT No.: PCT/JP2013/077217  
§ 371 (c)(1),  
(2) Date: Apr. 6, 2015

(87) PCT Pub. No.: WO2014/057902  
PCT Pub. Date: Apr. 17, 2014

(65) Prior Publication Data  
US 2015/0255419 A1    Sep. 10, 2015

(30) Foreign Application Priority Data

Oct. 9, 2012    (JP) .................................. 2012-224257

(51) Int. Cl.  
*H01L 23/00* (2006.01)  
*H01L 23/373* (2006.01)  
(Continued)

(52) U.S. Cl.  
CPC .............. *H01L 24/32* (2013.01); *C04B 37/026* (2013.01); *H01L 23/3735* (2013.01);  
(Continued)

(58) Field of Classification Search  
CPC . H01L 23/15; H01L 23/3731; H01L 23/3735; H01L 23/5328; H01L 23/53226; H01L 24/08; H01L 24/09; H01L 21/02203; H01L 2224/8384; H01L 2224/32221; H01L 2224/32225; H01L 2224/83201; H01L 22/34; H01L 24/05; H01L 2224/48247; H01L 2924/1532; H01L 23/142; H01L 2224/05639  
USPC ......... 257/276, 625, 675, 706, 707, 712–722, 257/783, 796, E33.075, E31.131, E23.051, 257/E23.08–E23.114, 178, E23.04, 257/700–703, 705, 779, E23.106, E23.109, 257/753, 762, 781; 228/194  
See application file for complete search history.

(56) References Cited

U.S. PATENT DOCUMENTS

2009/0244868 A1  10/2009  Morita et al.  
2011/0012262 A1*  1/2011  Morita .................... H01L 24/29  
                                                         257/741

(Continued)

FOREIGN PATENT DOCUMENTS

EP    1684340 A2    7/2006  
JP    07-022465 A   1/1995

(Continued)

OTHER PUBLICATIONS

International Search Report mailed Dec. 17, 2013, issued for PCT/JP2013/077217 and English translation thereof.  
Office Action mailed Jun. 24, 2014, issued for the Japanese patent application No. 2012-224257 and English translation thereof.  
Extended European Search Report, issued in corresponding European Patent Application No. 13846215.5, dated May 9, 2016.

*Primary Examiner* — Jasmine Clark  
(74) *Attorney, Agent, or Firm* — Locke Lord LLP; James E. Armstrong, IV; Nicholas J DiCeglie, Jr.

(57) ABSTRACT

A semiconductor device comprises a circuit layer composed of a conductive material, and a semiconductor element mounted on the circuit layer, wherein an underlayer having a porosity in the range of 5 to 55% is formed on one surface of the circuit layer, a bonding layer composed of a sintered body of a bonding material including an organic substance and at least one of metal particles and metal oxide particles is formed on the underlayer, and the circuit layer and the semiconductor element are bonded together via the underlayer and the bonding layer.

3 Claims, 6 Drawing Sheets

(51) Int. Cl.
  *H01L 23/473* (2006.01)
  *H01L 25/07* (2006.01)
  *H01L 25/18* (2006.01)
  *H01L 23/498* (2006.01)
  *C04B 37/02* (2006.01)
  *H01L 33/64* (2010.01)

(52) U.S. Cl.
  CPC ....... *H01L 23/473* (2013.01); *H01L 23/49822* (2013.01); *H01L 24/83* (2013.01); *H01L 25/07* (2013.01); *H01L 25/18* (2013.01); *C04B 2237/06* (2013.01); *C04B 2237/125* (2013.01); *C04B 2237/126* (2013.01); *C04B 2237/366* (2013.01); *C04B 2237/402* (2013.01); *C04B 2237/597* (2013.01); *C04B 2237/708* (2013.01); *C04B 2237/72* (2013.01); *H01L 33/641* (2013.01); *H01L 2224/32225* (2013.01); *H01L 2224/73265* (2013.01); *H01L 2224/8384* (2013.01); *H01L 2924/12042* (2013.01); *H01L 2924/1305* (2013.01); *H01L 2924/13055* (2013.01); *H01L 2924/13091* (2013.01); *H01L 2924/15787* (2013.01)

(56) References Cited

U.S. PATENT DOCUMENTS

2011/0075451 A1* 3/2011 Bayerer .................. H01L 24/06
  363/37
2012/0037688 A1 2/2012 Kock et al.

FOREIGN PATENT DOCUMENTS

| | | |
|---|---|---|
| JP | 2004-172378 A | 6/2004 |
| JP | 2006-032803 A | 2/2006 |
| JP | 2006-202938 A | 8/2006 |
| JP | 2006-202944 A | 8/2006 |
| JP | 2008-208442 A | 9/2008 |
| JP | 2008-311371 A | 12/2008 |
| JP | 2009-164208 A | 7/2009 |
| JP | 2009-267374 A | 11/2009 |
| JP | 2010-287869 A | 12/2010 |
| JP | 2011-150833 A | 8/2011 |
| JP | 2011-233735 A | 11/2011 |
| JP | 2011-236494 A | 11/2011 |
| JP | 2012-109315 A | 6/2012 |

* cited by examiner

SEMICONDUCTOR DEVICE AND CERAMIC CIRCUIT SUBSTRATE, AND PRODUCING METHOD OF SEMICONDUCTOR DEVICE

TECHNICAL FIELD

The present invention relates to a semiconductor device comprising a circuit layer composed of a conductive material and a semiconductor element mounted on the circuit layer, and a ceramic circuit substrate used in the semiconductor device, and a producing method of a semiconductor device.

Priority is claimed on Japanese Patent Application No. 2012-224257 filed Oct. 9, 2012, the contents of which are incorporated herein by reference.

BACKGROUND ART

In the semiconductor device such as a power module and a LED, it has a structure in which the semiconductor element is bonded onto a circuit layer composed of a conductive material.

For example, since a power semiconductor device of high-power control that is used to control wind power and electric vehicles such as electric automobiles generates a large amount of heat, as a substrate for mounting the power semiconductor device, for example, a ceramic circuit substrate in which a metal plate having an excellent conductivity and used as a circuit layer is bonded on a ceramic substrate composed of, for example, AlN (aluminum nitride) has been widely used conventionally.

For example, in the power module shown in Patent Document 1, it has a structure comprising a ceramic circuit substrate, one surface of which a circuit layer composed of metal is formed, and a semiconductor element bonded on the circuit layer. A heat sink is bonded to the other side of the ceramic circuit substrate, and the power module is configured so that the heat generated by the semiconductor device is transmitted to the ceramic circuit substrate side and dissipates to the outside via the heat radiation plate.

Here, when the electronic components such as semiconductor devices are bonded on the circuit layer, for example, as shown in Patent Document 1, a method using a solder material is widely used. Recently, from the viewpoint of environmental protection, for example, a lead-free solder which is Sn—Ag-based, Sn—In-based, Sn—Ag—Cu-based, or the like, is mainly used.

However, when, as described in Patent Document 1, when the electronic components such as semiconductor devices and the circuit layer are bonded together via the solder material, part of the solder is melted when used in a high temperature environment, and there is a possibility that bonding reliability between the circuit layer and the electronic components such as semiconductor devices is reduced.

In particular, in recent years, practical use of the compound semiconductor elements such as SiC or GaN is expected from silicon semiconductor, the improvement in heat resistance of the semiconductor element itself is expected, and therefore, it becomes difficult to meet the expectation by the structure which is bonded using the solder material as in the conventional one.

Therefore, as an alternative to solder, for example, in Patent Document 2, a technique in which a semiconductor element is bonded using a metal paste having metal particles and an organic substance has been proposed.

Further, in Patent Documents 3 and 4, a technique in which circuit electronic components such as semiconductor elements are bonded on a circuit using an oxide paste containing a reducing agent including metal oxide particles and an organic substance has been proposed.

In the metal paste that is described in Patent Document 2, it contains metal particles and an organic substance, and since the metal particles are sintered, the bonding layer consisting of a conductive sintered body is formed, and the electronic components such as semiconductor elements are bonded on the circuit layer via the bonding layer.

In the metal paste that is described in Patent Documents 3 and 4, a bonding layer consisting of a conductive sintered body is formed by sintering of metal particles produced by reducing metal oxide particles using the reducing agent, and the electronic components such as semiconductor elements are bonded on the circuit layer via the bonding layer.

Thus, when the bonding layer is formed of the sintered body of metal particles, the bonding layer can be formed at a relatively low temperature condition and the melting point of the bonding layer itself is increased. Therefore, the bonding strength does not significantly decrease even in a high temperature environment.

PRIOR ART DOCUMENTS

Patent Documents

[Patent Document 1] Japanese Unexamined Patent Application, First Publication No. 2004-172378
[Patent Document 2] Japanese Unexamined Patent Application, First Publication No. 2006-202938
[Patent Document 3] Japanese Unexamined Patent Application, First Publication No. 2008-208442
[Patent Document 4] Japanese Unexamined Patent Application, First Publication No. 2009-267374

DISCLOSURE OF THE INVENTION

Problems to be Solved by the Invention

As described in Patent Document 2, when the metal paste having metal particles and the organic substance is sintered, a gas is generated by the decomposition reaction of the organic substance.

In addition, as described in Patent Documents 3 and 4, when the oxide paste containing the reducing agent including metal oxide particles and the organic substance is sintered, and a gas is generated by the reduction reaction of the metal oxide particles in addition to the decomposition reaction of the organic substance.

Here, in the power module described above, when the semiconductor element and the circuit layer are bonded together by the metal paste or oxide paste, sintering of the metal paste or oxide paste progresses from the peripheral edge portion of the bonding surface between the semiconductor element and the circuit layer toward the central portion thereof due to non-uniformity of temperature or the like. In this case, at the time when the metal paste or oxide paste is sintered in the central part of the bonding surface, the sintering of the peripheral edge portion of the bonding surface has been completed, a gas generated by decomposition reaction of the organic substance occurred in the central portion of the bonding surface and by reduction reaction of the metal oxide particles would remain inside the bonding layer, and there is a possibility that the bonding strength between the circuit layer and the semiconductor element cannot be secured. Therefore, there is a possibility that the thermal resistance between the semiconductor element and the circuit layer increases and the heat generated by the semiconductor element cannot be efficiently transmitted to the circuit layer side.

Such a problem is not only similar in power module as described above, also similar in other semiconductor devices such as LED.

The present invention has been made in view of the above circumstances, and the purpose thereof is to provide a semiconductor device in which a circuit layer and semiconductor element are reliably bonded together using a bonding material including the organic substance and at least one or both of metal particles and metal oxide particles, and which can efficiently transmit heat generated by a semiconductor element toward the circuit layer side; a ceramic circuit substrate used in the semiconductor device; and a producing method of the semiconductor device.

Means for Solving the Problem (1) A semiconductor device according to an aspect of the present invention comprises a circuit layer composed of conductive material, and a semiconductor element mounted on the circuit layer, wherein an underlayer having a porosity in the range of 5 to 55% is formed on one surface of the circuit layer, a bonding layer composed of a sintered body of a bonding material including an organic substance and at least one or both of metal particles and metal oxide particles is formed on the underlayer, and the circuit layer and the semiconductor element are bonded together via the underlayer and the bonding layer.

According to the semiconductor device configured as above, since the underlayer having a porosity in the range of 5 to 55% is formed on the one surface of the circuit layer, when the bonding layer composed of a sintered body of the bonding material including the organic substance and at least one or both of metal particles and metal oxide particles is formed, even if the sintering proceeds from the peripheral edge portion of the bonding surface between the semiconductor element and the circuit layer toward the central portion thereof, a gas generated by decomposition reaction of the organic substance occurred in the central portion of the bonding surface and by reduction reaction of the metal oxide particles is discharged to outside of the bonding layer through pores of the underlayer, and the gas does not remain inside the bonding layer. Therefore, the thermal resistance between the semiconductor element and the circuit layer can be suppressed and heat generated by the semiconductor element can be efficiently transmitted to the circuit layer side.

In a case where the porosity of the underlayer is less than 5%, the gas cannot be efficiently discharged and there is a possibility that the gas remains in the bonding layer. On the other hand, in a case where the porosity of the underlayer exceeds 55%, the amount of pores is too large and there is a possibility that the bonding reliability between the semiconductor element and the circuit layer is reduced.

From the above reason, in the present invention, the porosity of the underlayer is set in the range of 55% 5 to 55%.

(2) The semiconductor device according to another aspect of the present invention is the semiconductor device described in (1) which includes a ceramic circuit substrate having the circuit layer and a ceramic substrate disposed on the other surface of the circuit layer, and the semiconductor element is a power semiconductor device.

According to the semiconductor device configured as above, even if a power semiconductor device having a large amount of heat generation is used, heat can be efficiently transferred to the circuit layer. In addition, as a power semiconductor device, IGBT (Insulated Gate Bipolar Transistor), MOSFET or the like can be used.

(3) The ceramic circuit substrate according to another aspect of the present invention and used in the semiconductor device described in (2) includes a circuit layer composed of a conductive material, an underlayer formed on the one surface of the circuit layer, and a ceramic substrate disposed on the other surface of the circuit layer, and a porosity of the underlayer is in the range of 5 to 55%.

According to the ceramic circuit substrate configured as above, since the underlayer having a porosity in the range of 5 to 55% is formed on the one surface of the circuit layer, even when the semiconductor element is bonded on the circuit layer using the bonding material including the organic substance and at least one or both of metal particles and the metal oxide particles, the gas generated by decomposition reaction of the organic substance occurred in the bonding material and by reduction reaction of the metal oxide can be discharged to the outside of the bonding layer through the pores of the underlayer, it is possible to prevent that the gas remains in the bonding layer composed of a sintered body of the bonding material, and the semiconductor element can be reliably bonded.

(4) A producing method of a semiconductor device according to another aspect of the present invention is a producing method thereof described in (1) and (2), and the producing method includes:

an underlayer forming step forming the underlayer having a porosity in the range of 5 to 55% on the one surface of the circuit layer;

a bonding material arranging step arranging a bonding material including the organic substance and at least one or both of metal particles and metal oxide particles on the underlayer a semiconductor element laminating step laminating the semiconductor element on the bonding material; and a sintering step heating the semiconductor element, the bonding material, the underlayer, and the circuit layer in the state of laminating them, and forming a bonding layer composed of a sintered body of the bonding material including the organic substance and at least one or both of metal particles and metal oxide particles on the underlayer, wherein the circuit layer and the semiconductor element are bonded together via the underlayer and the bonding layer.

According to the producing method of the semiconductor device configured as above, since the producing method includes the underlayer forming step forming the underlayer having a porosity in the range of 5 to 55% on the one surface of the circuit layer and the sintering step forming the bonding layer composed of a sintered body of the bonding material including the organic substance and at least one or both of metal particles and metal oxide particles on the underlayer, even if, in the sintering step, the sintering proceeds from the peripheral edge portion of the bonding surface between the semiconductor element and the circuit layer toward the central portion thereof, the gas generated by decomposition reaction of the organic substance occurred in the central portion of the bonding surface and by reduction reaction of the metal oxide particles can be discharged to the outside of the bonding layer through pores of the underlayer, and it is possible to prevent that the gas remains inside the bonding layer. Therefore, the semiconductor element and the circuit layer can be reliably bonded together.

Effects of the Invention

The present invention can provide: a semiconductor device in which a circuit layer and semiconductor element are reliably bonded together using a bonding material including the organic substance and at least one or both of metal particles and metal oxide particles, and which can efficiently transmit heat generated by a semiconductor element toward the circuit layer side; a ceramic circuit substrate used in the semiconductor device; and a producing method of the semiconductor device.

EMBODIMENTS OF THE INVENTION

Figure 1:
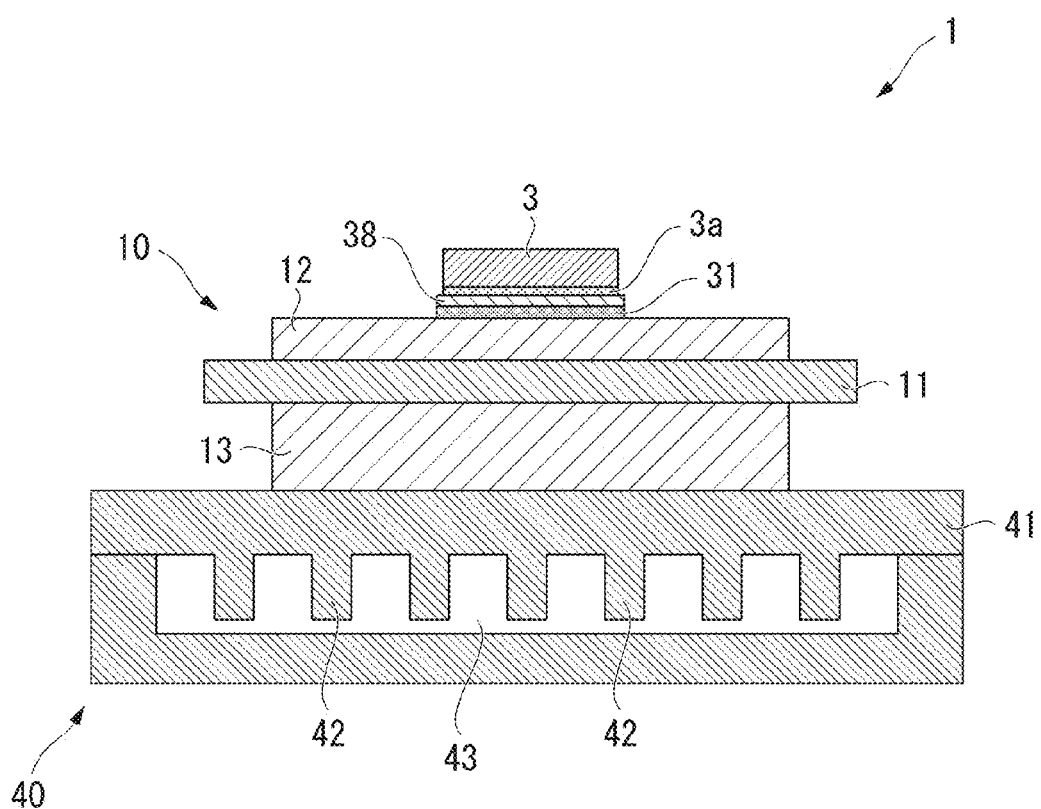
FIG. 1 is a schematic explanatory diagram of a semiconductor device (power module) according to a first embodiment of the present invention.

Hereinafter, an embodiment of the present invention will be described with reference to the attached drawings. In addition, a semiconductor device of the present embodiment is a power module on which a power semiconductor device of high-power control that is used to control wind power and electric vehicles such as electric automobiles is mounted. FIG. 1 shows a power module (semiconductor device) according to the embodiment of the present invention.

The power module 1 includes a ceramic circuit substrate 10, a semiconductor element 3, and a cooler 40. In the ceramic circuit substrate 10, a circuit layer 12 is disposed. Of a first surface (one surface, that is, upper surface in FIG. 1) and a second surface (the other surface, that is, lower surface in FIG. 1) of the circuit layer 12, the semiconductor element 3 is bonded to the first surface of the circuit layer 12. The cooler 40 is disposed to the other surface side with respect to the ceramic circuit substrate 10.

As shown in FIG. 1, the ceramic circuit substrate 10 includes; a ceramic substrate 11, the circuit layer 12, and a metal layer 13. The ceramic substrate 11 constitutes an insulation layer. The circuit layer 12 is disposed on one surface (upper surface in FIG. 1) of the ceramic substrate 11. The metal layer 13 is disposed on the other surface (lower surface in FIG. 1) of the ceramic substrate 11. That is, the ceramic substrate 11 has a first surface (the one surface) and a second surface (the other surface), the circuit layer 12 is disposed on the first surface of the ceramic substrate 11, and the metal layer 13 is disposed on the second surface of the ceramic substrate 11.

The ceramic substrate 11 is for preventing electric connection between the circuit layer 12 and the metal layer 13, and is composed of AlN (aluminum nitride), $Si_3N_4$ (silicon nitride), $Al_2O_3$ (alumina), or the like, having high insulation properties. In the present embodiment, it is composed of AlN which is excellent in heat dissipation properties. The thickness of the ceramic substrate 11 is set to be in the range of 0.2 to 1.5 mm, and in the present embodiment, the thickness thereof is set to 0.635 mm.

The circuit layer 12 is formed by bonding a metal plate composed of: aluminum or an aluminum alloy having electrical conductivity; or copper or a copper alloy, on the first surface of the ceramic substrate 11. In the present embodiment, the circuit layer 12 is formed by bonding a rolled sheet of aluminum having a purity of 99.99% by mass or more (so-called 4N aluminum), to the ceramic substrate 11. In addition, the thickness of the circuit layer 12 is set to be in the range of 0.1 to 1.0 mm, and in the present embodiment it is set to 0.6 mm. Also, a circuit pattern is formed in the circuit layer 12, and the first surface (upper surface in FIG. 1) of the circuit layer 12 is a bonding surface on which the semiconductor element 3 is bonded.

The metal layer 13 is formed by bonding a metal plate composed of: aluminum or an aluminum alloy; or copper or a copper alloy, on the second surface of the ceramic substrate 11. In the present embodiment, the metal plate (metal layer 13) is a rolled sheet of aluminum having a purity of 99.99% by mass or more (so-called 4N aluminum) Here, the thickness of the metal layer 13 is set to be in the range of 0.2 to 3.0 mm, and in the present embodiment, it is set to 1.6 mm.

The cooler 40 is for cooling the above-described ceramic circuit substrate 10, and includes a top board 41, a heat radiation fin(s) 42, and flow channels 43. The top board 41 is bonded to the ceramic circuit substrate 10. The heat radiation fins 42 are vertically disposed so as to be downward from the top board 41. The flow channels 43 are provided in order to allow flowing of a cooling medium (for example, cooling water) therein. The cooler 40 (including top board 41) is preferred to be configured by materials excellent in thermal conductivity, and in the present embodiment, it is configured by A6063 (aluminum alloy).

The semiconductor element 3 is configured of a semiconductor material such as Si, and in the bonding interface between the circuit layer 12 and the semiconductor element 3, a surface treated film 3a formed of Ni, Au, or the like, is formed.

In the power module 1 shown in FIG. 1, an underlayer 31 and a bonding layer 38 is formed between the circuit layer 12 and the semiconductor element 3.

As shown in FIG. 1, the underlayer 31 and the bonding layer 38 are not formed on the entire surface of the circuit layer 12, they are provided on a portion of the semiconductor device 3, namely, they are selectively formed on the bonding surface only bonded to the semiconductor element 3.

As shown in FIG. 1, the underlayer 31 is formed on the circuit layer 12, and the bonding layer 38 is formed on the underlayer 31.

Figure 2:
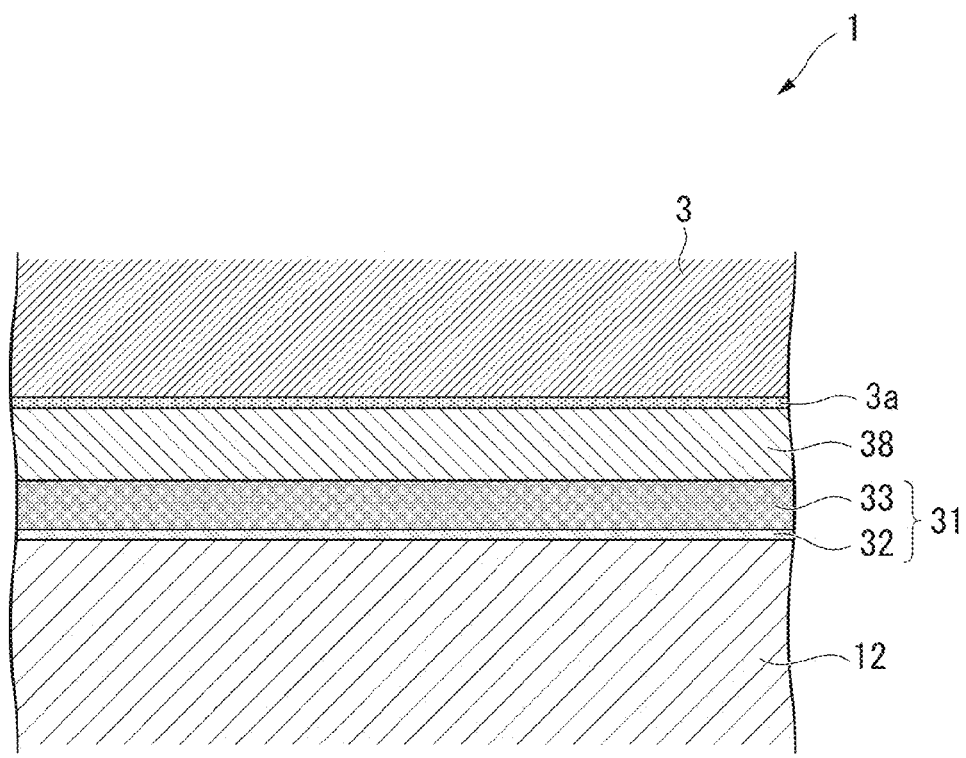
FIG. 2 is an enlarged explanatory view of a bonding interface between a circuit layer and the semiconductor element of the semiconductor device (power module) shown in FIG. 1.

Here, the underlayer 31 is a sintered body of a glass-containing Ag paste containing a glass component. As shown in FIG. 2, the underlayer 31 includes a glass layer 32, and an Ag layer 33. The glass layer 32 is formed to the circuit layer 12 side. That is, the glass layer 32 is formed on the circuit layer 12. The Ag layer 33 is formed on the glass layer 32.

In the inside of the glass layer 32, fine conductive particles having a particle size of several nanometers are dispersed. In addition, the conductive particles in the glass layer 32 are observed by using, for example, a transmission electron microscope (TEM).

Furthermore, in the inside of the Ag layer 33, glass particles having a particle size of several micrometers are dispersed.

The electrical resistance value P in the thickness direction of the underlayer 31 is set to be 0.5Ω or less. Here, in the present embodiment, the electrical resistance value P in the thickness direction of the underlayer 31 is an electrical resistance value between the upper surface of the underlayer 31 and the upper surface of the circuit layer 12. This is because, the electrical resistance value of aluminum (4N aluminum) constituting the circuit layer 12 is small as compared with the electrical resistance value in the thickness direction of the underlayer 31. In addition, when the electrical resistance value is measured, the electrical resistance between the center point of the upper surface of the underlayer 31 and a point on the circuit layer 12 away from an end of the underlayer 31 at the same distance as the distance from the center point of the upper surface of the underlayer 31 to the end of underlayer 31.

In the present embodiment, a plurality of pores are formed in the underlayer 31, and the porosity thereof is set in the range of 5 to 55%.

In addition, the pores formed in the underlayer 31 are continuous pores (open pores) opened to the outside, and they are configured so as to be opened to an outer circumferential surface (outer circumferential edge part of the bonding surface between the circuit layer 12 and the semiconductor element 3) of the underlayer 31.

Next, regarding the glass-containing Ag paste configuring the underlayer 31 is explained. The glass-containing Ag paste includes Ag powder, lead-free glass powder containing ZnO, resin, a solvent, and a dispersing agent. The content of the powder component formed of Ag powder and lead-free glass powder is 60 to 90% by mass of the entire content of the glass-containing Ag paste, and the balance thereof includes resin, the solvent and the dispersing agent. In addition, in the present embodiment, the content of the powder component formed of Ag powder and lead-free glass powder is 85% by mass of the entire content of the glass-containing Ag paste.

Here, a particle size of the Ag powder is set to be 0.05 to 10 μm. In addition, there is a tendency such that the larger the particle size of the Ag powder is, the higher the porosity of the formed underlayer 31 is. Thus, the particle thereof is preferred to set to be in the range of more than 1.0 μm to 10 μm or less. In addition, the shape of the Ag powder can have a spherical shape or can have a flat shape, or both shapes of them can be mixed.

The lead-free glass powder contains $Bi_2O_3$, ZnO, and $B_2O_3$ as a major component, the glass transition temperature thereof is 300 to 450° C., a softening temperature thereof is 600° C. or less, and a crystallization temperature thereof is 450° C. or more.

Further, the glass-containing Ag paste is adjusted to have the viscosity of 10 to 500 Pa·s, and more preferably, 50 to 300 Pa·s.

The solvent is suitable to have a boiling point of 200° C. or more, and in the present embodiment, a diethylene glycol dibutyl ether is used.

The resin is intended to adjust the viscosity of the glass-containing Ag paste, and the resin degraded in 500° C. or more is suitable. In this embodiment, the ethyl cellulose is used. In addition, there is a tendency that the porosity of the underlayer 31 after sintering is increased by increasing the content of the resin.

Further, in the present embodiment, a dicarboxylic acid based dispersing agent is added. In addition, the glass-containing Ag paste can be configured without adding the dispersing agent.

The above of the underlayer 31, that is, the bonding layer 38 formed on the 33 Ag layer is a sintered body of a bonding material including an organic substance and at least one or both of metal particles and metal oxide particles. In the present embodiment, it is a sintered body of silver oxide paste containing silver oxide and a reducing agent including an organic substance. That is, the bonding layer 38 is an Ag sintered body in which silver oxide is reduced. Here, since particles precipitated by the reduction of silver oxide have such a very fine particle size of 10 nm to 1 μm, an Ag sintered layer which is dense is formed. That is, since the particle size is fine, the fine particles fill the space which is present in the silver oxide paste during the sintering, and as the result, the Ag sintered layer which is dense is formed. In addition, in the bonding layer 38, glass particles observed in the Ag layer 33 of the underlayer 31 does not exist, or it is very small amount.

The silver oxide paste configuring the bonding layer 38 includes silver oxide powder, a reducing agent, resin, and a solvent. In the present embodiment, organometallic compound powder is included in addition of them.

The content of the silver oxide powder is 60 to 92% by mass of the entire content of silver oxide paste, the content of the reducing agent is 5 to 15% by mass of the entire content of the silver oxide paste, the content of the organometallic compound powder is 0 to 10% by mass of the entire content of silver oxide paste, and the balance is the solvent. In the silver oxide paste, in order to prevent from remaining of an unreacted organic substance in the bonding layer 38 obtained by sintering, it is desirable that the dispersing agent and the resin are not added.

The reducing agent is an organic substance having reducing properties, for example, alcohols or organic acids can be used therefor.

Organometallic compounds have an effect of promoting the reduction reaction of silver oxide and the decomposition reaction of the organic substance by organic acids produced by thermal decomposition, and for example, formic acid Ag, acetic Ag, propionic acid Ag, benzoic acid Ag, carboxylic acid based metal salts such as oxalic acid Ag, or the like, is applied.

The silver oxide paste is adjusted to have the viscosity of 10 to 100 Pa·s, and more preferably, 30 to 80 Pa·s.

Figure 4:
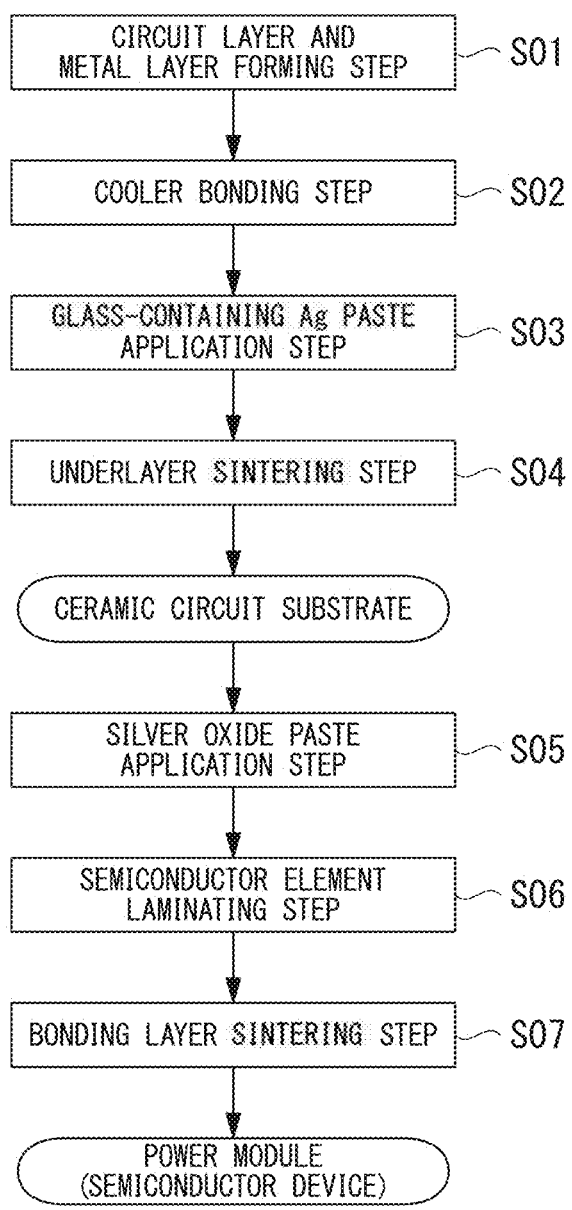
FIG. 4 is a flow chart explaining a producing method of the semiconductor device (power module) shown in FIG. 1.

Hereinafter, a producing method of the power module 1 according to the present embodiment will be explained with reference to the flow chart shown in FIG. 4.

First, a first aluminum plate which will be the circuit layer 12 and a second aluminum plate which will be the metal layer 13 are prepared, the first aluminum plate is laminated on the first surface of the ceramic substrate 11 via a brazing material and the second aluminum plate is laminated on the second surface of the ceramic substrate 11 via a brazing material, the aluminum plates and the ceramic substrate 11 are bonding together by heating them while pressurizing and then cooling them (circuit layer and metal layer forming step S01). In addition, the brazing temperature is set to 640 to 650° C.

Next, the cooler 40 is bonded to the other surface side of the metal layer 13 via a brazing material (cooler bonding step S02). In addition, the brazing temperature of the cooler 40 is set to 590 to 610° C.

The glass-containing Ag paste is applied on a surface of the circuit layer 12 (glass-containing Ag paste application step S03).

In addition, when the glass-containing Ag paste is applied, various methods such as screen printing method, offset printing method, and photosensitive process can be employed. In the present embodiment, the glass-containing Ag paste is formed by screen printing method in a portion of the circuit layer 12 on which the semiconductor element 3 will be mounted.

Next, after drying in a state of applying the glass-containing Ag paste on the surface of the circuit layer 12, sintering of the glass-containing Ag paste is performed by charging it into a heating furnace (underlayer sintering step S04). In addition, since there is a tendency that the porosity increases if the sintering temperature is low, in the present embodiment, the sintering temperature is set to 470 to 600° C. in the underlayer sintering step S04.

By the underlayer sintering step S04, the underlayer 31 including the glass layer 32 and the Ag layer 33 is formed on the one surface of the circuit layer 12. At this time, an aluminum oxide film spontaneously formed on the surface of the circuit layer 12 is melted and removed by the glass layer 32, and the glass layer 32 is formed directly on the circuit layer 12.

Moreover, fine conductive particles having a particle size of several nanometers are dispersed inside of the glass layer 32. The conductive particles are crystalline particles containing at least one of Al and Ag, and it is assumed that the conductive particles were deposited inside the glass layer 32 during sintering.

Furthermore, in the inside of the Ag layer 33, glass particles having a particle size of several micrometers are dispersed. In the process of progressing of sintering of the Ag particles, it is assumed that the glass particles are formed by the aggregation of the remained glass component.

In the present embodiment, by relatively enlarging the particle size of the Ag powder and setting the sintering temperature to a relatively low temperature, the underlayer 31 is formed to a porous state, and the porosity thereof is set to be in the range of 5 to 55%.

Figure 3:
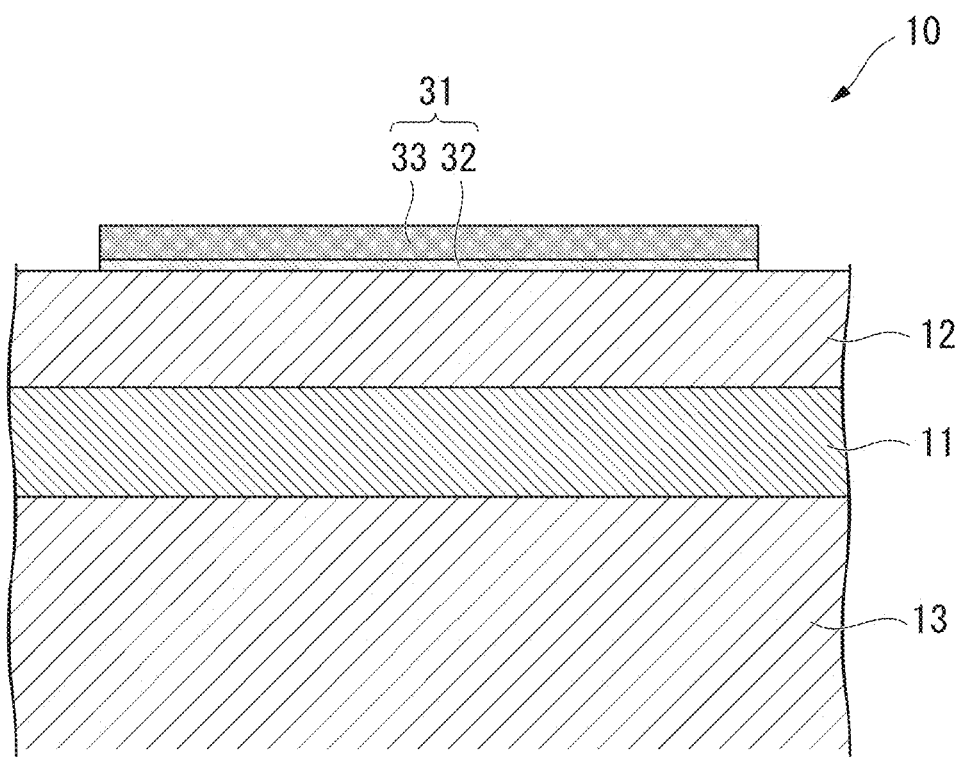
FIG. 3 is an explanatory view of a ceramic circuit substrate according to the first embodiment of the present invention.

In this way, as shown in FIG. 3, the ceramic circuit substrate 10 of the present embodiment in which the underlayer 31 is formed on the one surface of the circuit layer 12 is produced.

Next, a silver oxide paste is applied on the surface of the underlayer 31 of the ceramic circuit substrate 10 (silver oxide paste application step S05).

In addition, when the silver oxide paste is applied, various methods such as screen printing method, offset printing method, and photosensitive process can be employed. In the present embodiment, the silver oxide paste was printed by screen printing method.

Next, after drying in a state applying the silver oxide paste (for example, storage for 24 hours at room temperature in air atmosphere), the semiconductor element 3 is laminated on the silver oxide paste (semiconductor element stack step S06).

The semiconductor element 3 and the ceramic circuit substrate 10 are charged into the heating furnace in a state in which they are laminated, and sintering of the silver oxide paste is performed (bonding layer sintering step S07). At this time, the loading pressure is set to 0 to 10 MPa, and the sintering temperature is set to 150 to 400° C.

Further, desirably, by heating in a pressurized state in the lamination direction of the semiconductor element 3 and the ceramic circuit substrate 10, it can be bonded more reliably.

In the above-described manner, the bonding layer 38 is formed on the underlayer 31, and the semiconductor element 3 and the circuit layer 12 are bonded together. Accordingly, the power module 1 according to the present embodiment is produced.

According to the power module and ceramic circuit substrate of the present embodiment configured as above, since the underlayer 31 having a porosity in the range of 5 to 55% is formed on the one surface of the circuit layer 12, when the circuit layer and the semiconductor element 3 are bonded together via the bonding layer 38 composed of a sintered body of the silver oxide paste including silver oxide particles and a reducing agent, a gas generated by reduction reaction of the silver oxide and by decomposition reaction of the organic substance included in the oxide silver paste is discharged to the outside of the bonding layer through pores of the underlayer 31, and the remaining of the gas inside the bonding layer 38 can be prevented. Therefore, the thermal resistance between the semiconductor element 3 and the circuit layer 12 can be suppressed and heat generated by the semiconductor element 3 can be efficiently transmitted to the ceramic circuit substrate 10 side.

In the present embodiment, since a porosity of the underlayer 31 is set to 5% or more, the above-described gas can be reliably discharged and the remaining of the gas in the bonding layer 38 can be prevented. In addition, since a porosity of the underlayer 31 is set to 55% or less, the semiconductor element 3 and the circuit layer 12 are reliably bonded together, and the bonding reliability between the semiconductor element 3 and the circuit layer can be secured.

Further, in the present embodiment, since the bonding layer 38 is a sintered body of the silver oxide paste including silver oxide and the reducing agent, when the silver oxide paste is sintered, the silver oxide is reduced by the reducing agent and is formed to be fine silver particles, and the bonding layer 38 can have a dense structure. That is, the silver particles are fine, therefore fine silver particles fill the space which is present in the silver oxide paste during the sintering, and as the result, the bonding layer 38 having a dense structure is formed. Further, the reducing agent is decomposed when the silver oxide is reduced, and therefore, it is less likely to remain in the bonding layer 38, and the conductivity and strength of the bonding layer 38 can be secured. Furthermore, since it is possible to sinter in a relatively low temperature condition, for example, 300° C., the bonding temperature of the semiconductor element 3 can be suppressed in a low temperature, and the thermal load to the semiconductor device 3 can be reduced.

Furthermore, in the present embodiment, since the underlayer 31 includes the glass layer 32 formed on one surface of the circuit layer 12, and the Ag layer 33 laminated on the glass layer 32, the oxide film formed on the surface of circuit layer 12 can be removed by being reacted with the glass layer 32, and the circuit layer 12 and the semiconductor element 3 can be reliably bonded together.

Moreover, in the present embodiment, fine conductive particles having a particle size of several nanometers are dispersed inside the inner glass layer 32, the conductivity is ensured even in the glass layer 32, particularly, since the electrical resistance value P in the thickness direction of the underlayer 31 including the glass layer 32 is set to be 0.5Ω or less, electrical continuity between the semiconductor element 3 and the circuit layer 12 through the underlayer 31 and the bonding layer 38 can be reliably obtained, and a power module 1 having high reliability can be configured.

The embodiment of the present invention has been explained as above; however, the present invention is not limited thereto and can be appropriately changed without departing from the technical concept of the present invention.

For example, in the present embodiment, it is described that the underlayer 31 having the porosity of 5 to 55% is formed by using the glass-containing Ag paste; however, it is not limited thereto. The pores can be formed in the underlayer by containing beads in the paste or the pores can be formed in the underlayer by containing a foaming agent in the paste. Regardless of the process, a porosity of the underlayer has only to be set in the range of 5 to 55%.

Further, the raw material of the glass-containing Ag paste and a blending amount thereof are not limited to those described in the embodiment. For example, it has been described that a lead-free glass powder is used, but a glass containing lead can be used.

Furthermore, as a bonding material which forms the bonding layer, it has been described that the silver oxide paste containing silver oxide is used; however, it is not limited thereto. A paste including metal oxide particles or other metal particles such as gold or copper can be used.

In addition, the raw material of the silver oxide paste and a blending amount thereof are not limited to those described in the embodiment. For example, it can be a material which does not include organometallic compounds.

Further, the silver oxide paste can contain the Ag particles in addition to the silver oxide powder and reducing agent. Ag particles are interposed between the silver oxide powder, and therefore, Ag obtained by the reduction of silver oxide and the Ag particles are sintered, and the bonding layer can have a further dense structure. Therefore, it is possible to set a lower applied pressure of the semiconductor element in the bonding process.

Further, the organic substance can be included in the surface layer of the Ag particles. In this case, it is possible to improve the sinterability at a low temperature by using the heat when the organic substance is decomposed.

Furthermore, the thickness of the glass layer 32 and Ag layer 33 of the underlayer 31 and the thickness of the bonding layer 38 are not limited to the embodiment.

It is also possible to form the bonding layer by a paste containing Ag powder. The paste can contain Ag powder, resin and a solvent. In this case, since the Ag powder is sintered during heating and a gas generated by a decomposition reaction of the organic substance such as the resin and solvent is discharged to the outside of the bonding layer through the pores of the underlayer, a dense bonding layer can be formed. That is, because the gas generated by a decomposition reaction of the organic substance such as the resin and solvent is discharged to the outside of the bonding layer through the pores of the underlayer 31, the gas does not remain in the bonding layer, and as a result, in the bonding layer, cavities or the like due to the gas remaining in the bonding layer are never formed. Therefore, a dense bonding layer can be formed.

Further, in the present embodiment, it has been described in that each of the circuit layer and the metal layer is composed of an aluminum plate; however, it is not limited thereto. Each of the circuit layer and the metal layer can be composed of an aluminum plate or an aluminum alloy plate, or a copper plate or a copper alloy plate.

Furthermore, the present embodiment has been described in that the ceramic substrate composed of AlN is used as an insulation layer; however, it is not limited thereto. A ceramic substrate composed of $Si_3N_4$, $Al_2O_3$, or the like, can be used and an insulating resin can be used as an insulation layer.

In addition, the present embodiment has been described in that the aluminum plate and the ceramic substrate are bonded by brazing; however, it is not limited thereto. A method such as Transient Liquid Phase Diffusion Bonding method and casting method can be applied.

In addition, in the case of composing the metal plate forming the circuit layer and metal layer by copper or a copper alloy, when the metal plate composed of copper or a copper alloy is bonded to the ceramic substrate, a method such as direct bonding method (DBC method), active metal brazing method and casting method can be applied.

Further, the present embodiment has been described in that after bonding the cooler along with bonding the aluminum plate used as the circuit layer to the ceramic substrate, the underlayer is formed on the circuit layer; however, it is not limited thereto. the underlayer can be formed before bonding the aluminum plate to the ceramic substrate, or before bonding the cooler.

Further, it has been described in that the top board of the cooler is composed of aluminum; however, it can be composed of an aluminum alloy or a composite material or the like containing aluminum, or can be composed of other materials. Furthermore, the cooler has been described in that it has the heat radiating fins and the flow channels for the cooling medium; however, there is no particular limitation on the structure of the cooler.

Further, in the present embodiment, a power module on which a power semiconductor device is mounted has been described as an example of a semiconductor device; however, it is not limited thereto. It suffices that a semiconductor device that a semiconductor element is mounted on a circuit layer composed of a conductive material.

Figure 5:
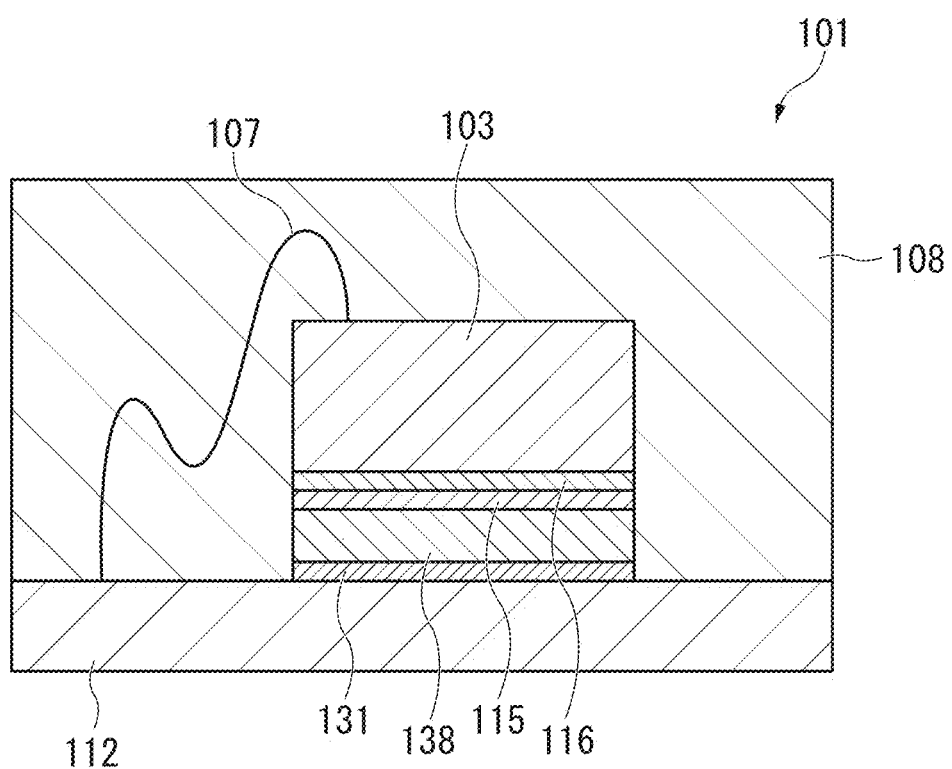
FIG. 5 is a schematic explanatory diagram of a semiconductor device (LED device) according to another embodiment of the present invention.

For example, as shown in FIG. 5, an LED unit (semiconductor device) equipped with LED element (semiconductor element) can be used.

The LED unit 101 shown in FIG. 5 includes a light emitting element 103, and a circuit layer 112 composed of a conductive material. In addition, the light emitting element 103 is electrically connected to the circuit layer 112 by a bonding wire 107, and the LED unit 101 has a structure in which the light emitting element 103 and the bonding wires 107 are sealed by a sealing material 108. On one surface of the circuit layer 112, an underlayer 131 having the porosity in the range of 5 to 55% is provided, and on the rear surface of the light emitting element 103, a conductive reflective film 116 and a protective film 115 are provided. On the underlayer 131, a bonding layer 138 composed of a sintered body of the bonding material and an organic substance and at least one or both of metal particles and metal oxide particles are formed, and the LED unit 101 has a structure in which the circuit layer 112 and the light emitting element 103 are bonded together via the underlayer 131 and the bonding layer 138.

Even in such LED device 101, since the underlayer 131 having the porosity in the range of 5 to 55% is provided on the one surface of the circuit layer 112, and a gas due to decomposition reaction of the organic substance and reduction reaction of metal oxide particles can be discharged to the outside of the bonding layer through the pores of the underlayer 131, and the remaining of the gas in the bonding layer 138 can be prevented.

EXAMPLES

Hereinafter, the results of the confirmation experiment which was performed to confirm the effects of the present invention are explained.

By using a ceramic circuit substrate shown below, a porosity of the underlayer was varied, and various semiconductor devices (power modules) were produced.

The ceramic circuit substrate was produced by brazing an aluminum plate, which will be used as a circuit layer, on one surface of the ceramic substrate and brazing another aluminum plate, which will be used as a metal layer, on the other surface of the ceramic substrate. Here, the ceramic substrate was AlN, the size of which was 27 mm×17 mm×0.6 mm. The aluminum plate, which will be used as a circuit layer, was 4N aluminum having a purity of 99.99% by mass or more, and the size of which was 25 mm×15 mm×0.6 mm. The aluminum plate, which will be used as a metal layer, was 4N aluminum having a purity of 99.99% by mass or more, and the size of which was 25 mm×15 mm×1.6 mm.

The semiconductor element having a size of 13 mm×10 mm×0.25 mm was used.

By using a glass-containing Ag paste exemplified in the embodiment, the underlayer was formed on the aluminum plate by screen printing method. In addition, the application thickness of glass-containing Ag paste was 10 μm.

Here, the shape and particle size of Ag powder included in the glass-containing Ag paste, and the sintering conditions of the glass-containing Ag paste were adjusted as shown in Table 1.

With respect to the porosity of the underlayer formed in the above manner, it was evaluated as follows.

After cutting the obtained ceramic circuit substrate and mechanically polishing the cross-section of the underlayer, Ar ion etching (manufactured by Nippon Electronics Co., Ltd. Cross Section Polisher SM-09010) was performed, and an observation of the cross-section thereof using a laser microscope (manufactured by Keyence Corporation VK X-200) was performed.

Figure 6A:
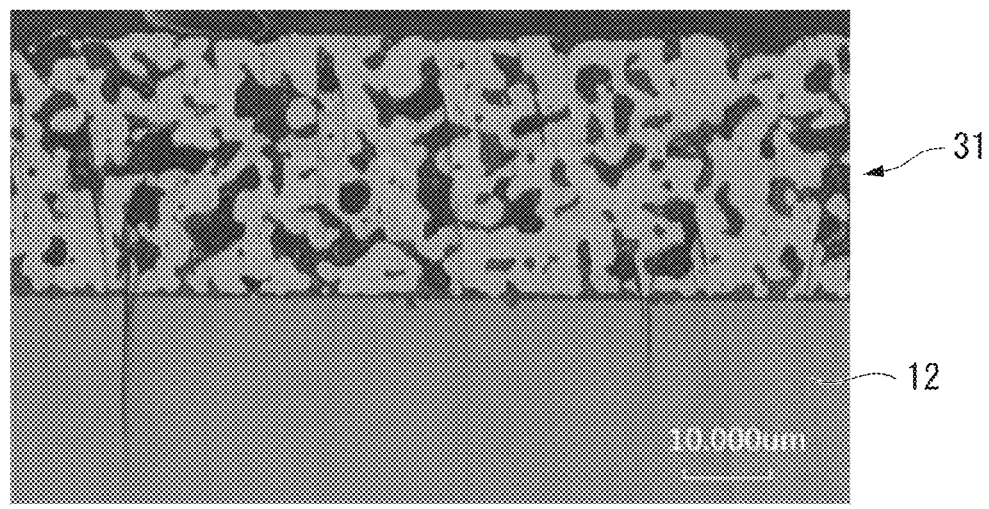
FIG. 6A is a cross-sectional photograph of an underlayer of present invention Example 1 of the present invention in Examples.
Figure 6B:
FIG. 6B is an image obtained by binarizing the photograph of the cross section of the underlayer of the present invention Example 1 in the Examples.

Then, the obtained images were converted to binarized images, and white portions therein were determined as Ag and glass, and black portions therein were determined as pores. In addition, FIG. 6A shows a cross-sectional observation photograph of the present invention Example 1, and FIG. 6B shows an image converted to a binarized image of this cross-sectional observation photograph. From the binarized image, the area of the black portions was calculated, and the porosity was calculated from the expression shown below. 5 points of the cross-section thereof were measured, and arithmetic average of the porosity of each cross-section was obtained, and the porosity of the underlayer was determined. The results are shown in Table 1.

Porosity=Area of Black Portions (pores)/Entire Area of Underlayer

Using a silver oxide paste exemplified in the embodiment, the semiconductor element and the circuit layer were bonded together. In addition, the application thickness of the silver oxide paste was 50 μm, and the sintering conditions were 300° C. of a sintering temperature, 10 minutes of a sintering time, 3 MPa of a load pressure. In accordance with the above, the various semiconductor devices were produced.

With respect to the obtained various semiconductor devices, the initial bonding rate and the thermal resistance were evaluated.

The bonding rate was evaluated using an ultrasonic flaw detection device and was calculated using the expression shown below. Here, the initial bonding area is an area, which is intended to be bonded at the time before bonding, that is, an area of the semiconductor element. Since a non-bonding part is indicated by a white part in the bonding portion in an ultrasonic flaw detection image, the area of the white part is determined as a non-bonding area.

(Bonding rate)={(Initial bonding area)−(Non-bonding area)}/(Initial bonding area)

The thermal resistance was measured as follows. Each of semiconductor devices were produced by using a heater chip as a semiconductor element, and the semiconductor devices were bonded by brazing to a cooler. Next, the heater chip was heated by power of 100 W, and the temperature of the heater chip was measured using a thermocouple. Also, the temperature of a cooling medium (ethylene glycol:water=9:1) flowing through the cooler was measured. A value in which the temperature difference between the heater chip and the cooling medium is divided by power was defined as the thermal resistance.

In addition, the conventional example in which the porosity of the underlayer is 2% is defined as 1 as a standard, and the samples were evaluated as a fraction of the conventional example. The results are shown in Table 1.

TABLE 1

|  | Ag particle paste | | Underlayer | | Evaluation | |
| --- | --- | --- | --- | --- | --- | --- |
|  | Particle size (μm) | Shape | Sintering Temperature | Porosity rate | Initial bonding rate | Thermal Resistance |
| Present Invention Example 1 | 2 | spherical | 500° C. | 48% | 95% | 0.92 |
| Present Invention Example 2 | 2 | spherical | 550° C. | 42% | 93% | 0.93 |
| Present Invention Example 3 | 2 | spherical | 600° C. | 30% | 91% | 0.95 |
| Present Invention Example 4 | 0.2 | spherical | 550° C. | 6% | 90% | 0.97 |
| Present Invention Example 5 | 8 | spherical | 600° C. | 48% | 95% | 0.92 |
| Present Invention Example 6 | 5 | spherical | 600° C. | 35% | 93% | 0.93 |
| Present Invention Example 7 | 5 | flat | 600° C. | 42% | 95% | 0.92 |
| Present Invention Example 8 | 5 | flat | 500° C. | 51% | 96% | 0.9 |
| Present Invention Example 9 | 0.2 | spherical | 475° C. | 54% | 90% | 0.98 |
| Comparative Example | 15 | spherical | 575° C. | 68% | 88% | 1.3 |
| Conventional Example | 0.2 | spherical | 575° C. | 2% | 70% | 1 |

In the conventional example in which the porosity of the underlayer is 2%, the initial bonding rate was 70%. It is presumed that a gas was generated during sintering of the silver oxide paste remains in the bonding layer and voids were generated.

On the other hand, in the Comparative Example in which the porosity of the underlayer is 68%, the initial bonding rate was 88% and was high as compared with the Conventional Example; however, the thermal resistance became higher than the Conventional Example. This is presumed that this is because the heat generated by the semiconductor element was not efficiently transmitted to the circuit layer side by the presence of a large amount of pores in the underlayer.

In contrast, in the Present Invention Examples 1 to 9 in which the porosity of the underlayer is set in the range of 5 to 55%, the initial bonding rate was 90% or more and was high, and the thermal resistance was lowered as compared with the Conventional Example.

In accordance with the above, according to the Present Invention Examples, it has been confirmed that a semiconductor device in which the circuit layer and semiconductor element are reliably bonded together and heat generated by the semiconductor device can be efficiently transmitted to the circuit layer side can be obtained.

FIELD OF INDUSTRIAL APPLICATION

The present invention can provide: a semiconductor device in which a circuit layer and semiconductor element are reliably bonded together using a bonding material including the organic substance and at least one or both of metal particles and metal oxide particles, and which can efficiently transmit heat generated by a semiconductor element toward the circuit layer side; a ceramic circuit substrate used in the semiconductor device; and a producing method of the semiconductor device.

DESCRIPTION OF REFERENCE SIGNS

1: Power module (Semiconductor device)
3: Semiconductor element
10: Ceramic circuit substrate
11: Ceramic substrate (Insulation layer)
12: Circuit layer
31: Underlayer
38: Bonding layer
101: LED unit (Semiconductor device)
103: light emitting element (Semiconductor element)
112: Circuit layer
131: Underlayer
138: Bonding layer

What is claimed is:

1. A semiconductor device comprising:
    a circuit layer composed of a conductive material; and
    a semiconductor element mounted on the circuit layer,
    wherein an underlayer having a porosity in the range of 5 to 42% is formed on one surface of the circuit layer, and includes a glass layer and an Ag layer having glass particles dispersed within the Ag layer,
    a bonding layer composed of a sintered body of a bonding material including an organic substance and at least one of metal particles and metal oxide particles is formed on the underlayer, and
    the circuit layer and the semiconductor element are bonded together via the underlayer and the bonding layer.

2. The semiconductor device according to claim 1 comprises:
    a ceramic circuit substrate having the circuit layer and a ceramic substrate disposed on the other surface of the circuit layer,
    wherein the semiconductor element is a power semiconductor device.

3. The ceramic circuit substrate used in the semiconductor device according to claim 2 comprises:
    a circuit layer composed of a conductive material,
    an underlayer formed on one surface of the circuit layer and including a glass layer and an Ag layer having glass particles dispersed within the Ag layer, and
    a ceramic substrate disposed on the other surface of the circuit layer,
    wherein the porosity of the underlayer is in the range of 5 to 42%.

* * * * *